(12) United States Patent
Sawadski et al.

(10) Patent No.: US 9,198,317 B2
(45) Date of Patent: Nov. 24, 2015

(54) MULTI-FUNCTIONAL FPC ASSEMBLY

(71) Applicant: Google Technology Holdings LLC, Mountain View, CA (US)

(72) Inventors: Michael J. Sawadski, Mount Prospect, IL (US); Jacob D. Wilson, Volo, IL (US); Jason P. Wojack, Libertyville, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 144 days.

(21) Appl. No.: 13/742,665

(22) Filed: Jan. 16, 2013

(65) Prior Publication Data

US 2014/0198466 A1 Jul. 17, 2014

(51) Int. Cl.
| | |
|---|---|
| H05K 1/00 | (2006.01) |
| H05K 7/06 | (2006.01) |
| H05K 1/11 | (2006.01) |
| H05K 1/14 | (2006.01) |
| H05K 3/36 | (2006.01) |
| H01Q 1/24 | (2006.01) |
| H01Q 1/38 | (2006.01) |

(Continued)

(52) U.S. Cl.
CPC ............... *H05K 7/06* (2013.01); *H01Q 1/243* (2013.01); *H01Q 1/38* (2013.01); *H05K 1/118* (2013.01); *H05K 1/147* (2013.01); *H05K 3/361* (2013.01); *H04M 1/03* (2013.01)

(58) Field of Classification Search
CPC . H05K 1/028; H05K 1/0283; H05K 2201/05; H05K 1/189; H05K 1/0393; H05K 1/118; H05K 1/147; H05K 3/361; H05K 3/4635; H05K 2201/051; H05K 2201/052; H05K 2201/053; H05K 2201/055; H05K 2201/056; H05K 2201/057; H05K 2201/058; H05K 2201/02
USPC .......... 361/749, 751, 679.01, 679.02, 679.12, 361/679.15, 679.21, 679.26, 679.27, 361/679.28, 748, 750, 755; 174/378, 254; 349/150
See application file for complete search history.

(56) References Cited

U.S. PATENT DOCUMENTS 3,556,388 A * 1/1971 Klein .............................. 229/247
4,887,690 A * 12/1989 Patel .............................. 181/150

(Continued)

FOREIGN PATENT DOCUMENTS

EP 1986477 A2 10/2008

OTHER PUBLICATIONS

International Search Report and Written Opinion for PCT/US2013/078215, mailed May 28, 2014.

(Continued)

*Primary Examiner* — Hoa C Nguyen
*Assistant Examiner* — Binh Tran
(74) *Attorney, Agent, or Firm* — Wolfe-SBMC

(57) ABSTRACT

An improved multi-functional flexible printed circuit (FPC) assembly 142 is provided for use in an electronic communications device 100. The FPC assembly 142 can comprise a curved FPC 144 a flexible substrate 156 and components thereon and can be positioned against a portion of an interior surface 137 of the housing 106 so as to share common wall surfaces for improved volumetric space utilization. The FPC assembly 142 can have a curved contour which matches a curvature of the curved housing 106. The components can include flexible metal conductors 158, multiple antennas 160 and 162, speaker felt 150 and/or a seal or gasket 146.

15 Claims, 4 Drawing Sheets

(51) Int. Cl.
*H05K 7/00* (2006.01)
*H04M 1/03* (2006.01)

(56) References Cited

U.S. PATENT DOCUMENTS

| | | | |
|---|---|---|---|
| 6,049,813 A * | 4/2000 | Danielson et al. | 708/100 |
| 8,248,310 B2 | 8/2012 | Hung et al. | |
| 2005/0181841 A1* | 8/2005 | Dou | 455/575.1 |
| 2006/0099993 A1 | 5/2006 | Leinonen et al. | |
| 2011/0111719 A1* | 5/2011 | Man et al. | 455/269 |
| 2012/0007078 A1* | 1/2012 | Shimomura et al. | 257/52 |
| 2012/0068888 A1 | 3/2012 | Tsung-Wen et al. | |
| 2012/0224710 A1* | 9/2012 | Terlizzi et al. | 381/74 |
| 2012/0229882 A1* | 9/2012 | Fish et al. | 359/267 |
| 2013/0076636 A1 | 3/2013 | Steiner et al. | |
| 2013/0224981 A1 | 8/2013 | Liu et al. | |
| 2014/0111684 A1* | 4/2014 | Corbin et al. | 348/374 |

OTHER PUBLICATIONS

Wu et al., "Flexible Printed Circuit Board (FPC) Antennas for Mobile Phone Operation," *Microsystems Packaging Assembly and Circuits Technology Conference (Impact)*, 2010 5th International, IEEE, pp. 1-4 (2010).

Zhao et al., "The Use of Murata Ceramic Bluetooth Antenna for Wrist Device Based on Flexible Printed Circuit Boards," *Wireless Technology, EUWIT*, IEEE, pp. 334-337(2008).

* cited by examiner

MULTI-FUNCTIONAL FPC ASSEMBLY

BACKGROUND OF THE INVENTION

1. Field of the Disclosure

The disclosure relates in general to electronics communications devices and more particularly to a flexible printed circuit assembly for mobile electronic devices, such as mobile phones.

2. Background Art

Reduction in XYZ dimensions and increased curvature on mobile phones has drastically impacted the clustering of many parts and components such as a loud speaker, ear piece speaker, headset jack, front-facing imager (camera), rear-facing imager, proximity infrared sensors, antennas, etc., by creating minimal room for housing alignment walls for sealing and separation of all these parts and components.

Flexible printed circuit (FPC) based antennas have been used in wireless communication products. Cosmetic or functional labels have been integrated with conventional FPC antennas. In the past, such conventional FPC antennas have been applied to outer surfaces of internal chassis elements and subsequently covered with battery doors and the like in the wireless communications products.

Over the years various electronic communications devices have been developed or suggested with printed circuit boards, flexible antennas and/or flexible printed circuits. Such conventional electronic communications devices have met with varying degrees of success.

It is, therefore, desirable to provide an improved electronic communications device with a multi-functional FPC assembly, which overcomes most, if not all of the preceding disadvantages.

DETAILED DESCRIPTION OF THE INVENTION

Figure 1:
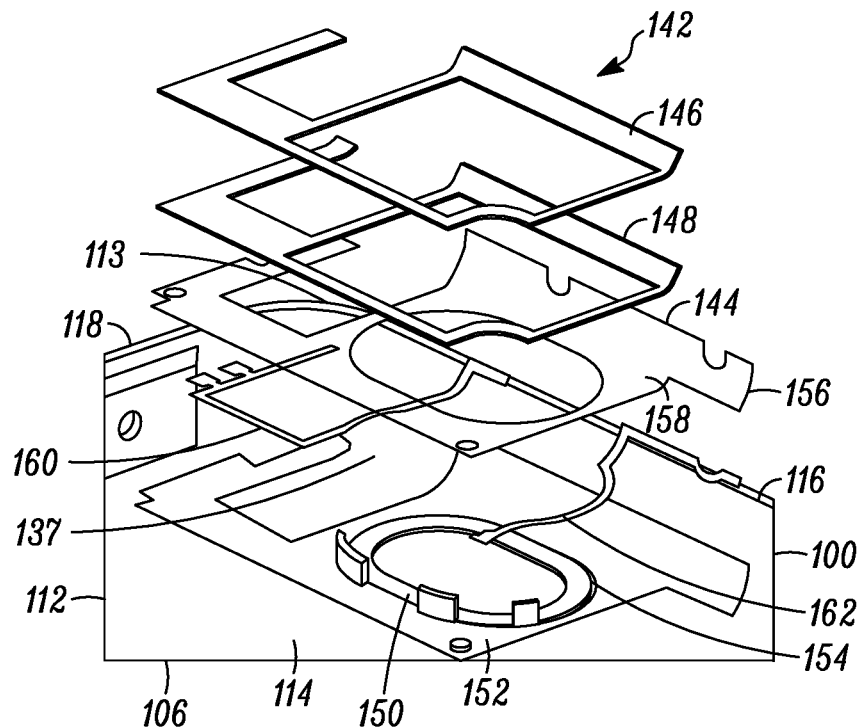
FIG. 1 is an exploded view of a multi-functional flexible printed circuit (FPC) assembly for use in an electronic communications device in accordance with principles of the present invention.
Figure 2:
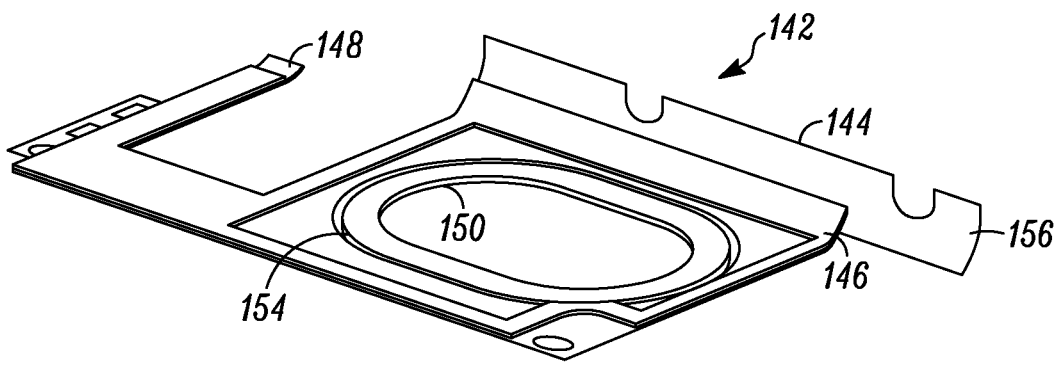
FIG. 2 is a perspective view of part of a multi-functional FPC assembly for use in an electronic communications device in accordance with principles of the present invention.

An improved electronic communications device with a multi-functional flexible printed circuit (FPC) assembly is provided which can overcome and resolve the preceding disadvantages by combining parts, components, and/or other items into a single unit and uber assembly. The improved electronic communications device with a multi-functional FPC assembly is compact, attractive, and easy to use. Advantageously, the user friendly electronic communications device with a multi-functional FPC assembly is efficient, dependable and effective.

The multi-functional FPC assembly can cluster numerous components and parts closer together while reducing the complexity of the housing design of the electronic communications device. The flex of the multi-functional FPC assembly preferably can match the 3D curvature of the housing of the electronic communications device which can be optimal for the antenna design and can allow the sealing of acoustic chambers to also be based on the curved surface of the housing of the electronic communications device. The single flex assembly can create a surface without any steps making acoustic and water seals robust. Based on assembly sequence, numerous components can now share walls of the housing for alignment and sealing instead of needing separate walls.

Using a FPC as the main carrier, multiple antennas can be integrated with their feeds, speaker meshes and acoustic chamber gaskets. Water seals and dust gaskets can be added creating an uber assembly that can be placed as one assembly onto two dimensional (2D) and/or three dimensional (3D) surfaces.

The method of assembling the FPC assembly in the electronics communications device can provide an electronics packaging technique of combining multiple functions into a single FPC based sub-assembly. In one embodiment, an FPC assembly can be provided that: (1) combines two antennas on a single FPC; (2) allows the antennas to follow a 2D contour of the housing to the degree allowed by the FPC; (3) provides a conformable seal for an acoustic transducer (speaker) with die cut elastomeric foam; and (4) achieves integrated assembly which results in better internal volume utilization for a commonly grouped set of components.

The FPC assembly can have functional components which can be co-located and banded together by a common seal shape improving volumetric space utilization in a portable electronic communication device. The FPC assembly can have a matching 2D curvature or faceted 3D shape approximation for a secondary acoustic seal allowing increased enclosed acoustic back-volume garnered from previously unused space. Desirably, almost any wireless communication device with limited internal 3D volume that incorporates audio transducers and antenna elements could use the inventive multi-functional assembly.

The FPC assembly can provide a unique packaging method of collecting FPC type antennas together with sealing functions for audio transducers and connectors. Numerous useful product with limited space allocated for these clustered components can be produced.

The FPC assembly can comprise a FPC, preferably a flexible FPC, with a flexible substrate and components thereon and can be positioned against a portion of an inwardly facing interior surface of an elongated wall and transverse wall of a housing of the electronic communications device. In the illustrative embodiment: the components can be clustered and secured to the flexible substrate, the components share common wall surfaces; the housing comprises a curved housing such that the interior surface of the housing comprises a curved surface portion; the FPC assembly comprises a curved compact FPC with a curved contour which matches a curvature of the curved housing; and the curved FPC assembly cooperates with the curved housing for improved volumetric space utilization.

The components can include flexible metal conductors comprising metallic foil, copper foil, and/or aluminum foil. The components can also include one or more antennas. Furthermore, the components can include speaker felt and/or a seal comprising one or more of the following: a gasket, an acoustic chamber gasket, water seal gasket, an acoustic seal for enhanced acoustic back-volume, or combinations thereof.

The flexible plastic substrate can comprise: a flexible substrate film, a flexible laminated board, a flexible board, a flexible circuit board, a single sided substrate, a double sided substrate, or combinations thereof.

The electronic communications device can comprise one or more of the following: a portable electronic device, a radiotelephone, cellular (cell) phone, mobile phone, smart phone, qwerty phone, flip phone, slider phone, android phone, tablet phone, camera phone, clamshell device, portable networking device, portable gaming device, mobile communications device, personal digital assistant (PDA), wireless e-mail device, a two way pager, internet communication device, android tablet, ipod, ipad, kindle, electronic reading device, electronic photo frame, digital photo frame, digital picture frame, video player, audio player, electronic calculator, electronic monitor, blackberry, tablet device, video device, electronic processor, mobile computing device, computer, netbook, data sharing device, wireless device, handheld electronic communications device, global positioning system (GPS), navigation device, transmitting device, electronic receiving device, electronic planner, workout planner, electronic calendar, scheduling device, music player, MP3 player, performance monitor, golf tracker, incoming call notifier, answering machine, statistical storage device, data storage device, information storage device, cadence sensor, goal setting device, fitness tracker, exercise monitor, sports monitor, workout frequency monitor, downloadable device, computer, a device compatible with the Bluetooth® communications protocol, data sharing device, and a hand held electronic device.

The improved electronic communications device with a FPC assembly as described in the patent claims has achieved unexpected surprisingly good results.

The following is a detailed description and explanation of the preferred embodiments of the invention and best modes for practicing the invention.

Figure 7:
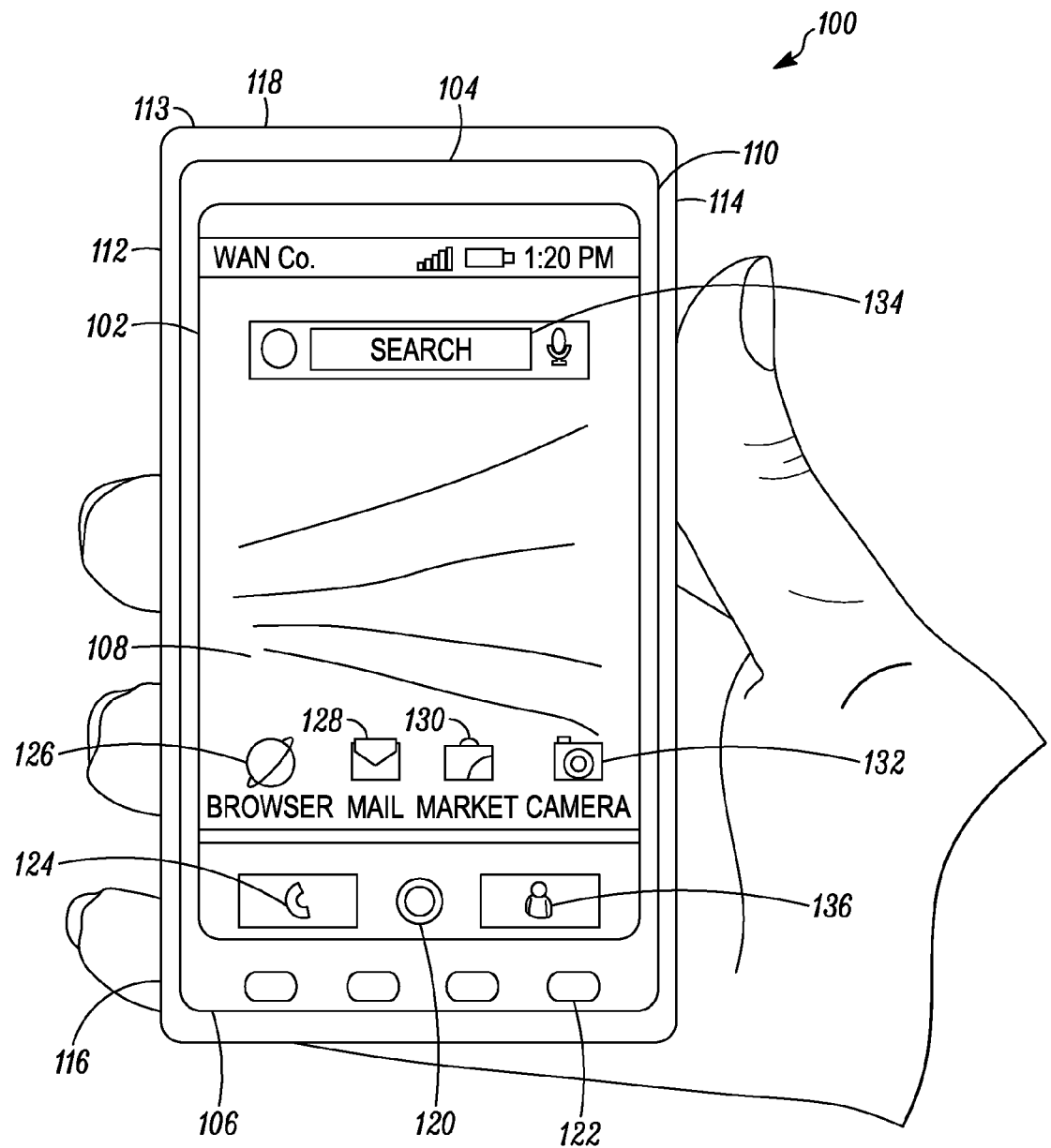
FIG. 7 is a front view of a hand held electronic communications device in accordance with principles of the present invention.

Referring to FIG. 7 of the drawings, a mobile electronic communications device 100 is shown which can be operable for mobile phone communications. The electronic communications device can be moveable and pivotable from a landscape orientation mode (landscape mode or landscape orientation) to a portrait orientation mode (portrait mode or portrait orientation) and vice versa. The mobile electronic communications device can have a display module 102 and a chassis which can comprise a modular housing assembly 104 with a modular impact-resistant curved housing 106 to securely hold the display module. The display module can comprise an electronic visual display 108 for displaying images. The electronic visual display can comprise an elongated, generally rectangular display lens. The display lens can comprise a user interface (UI) and can have a touch sensitive haptic elongated front lens surface. The display lens can comprise: a glass lens, transparent lens, touch sensitive lens, haptic lens, screen, impact-resistant screen, display screen, touchscreen, screen with an accelerator, monitor, light emitting display, or combinations of any of the preceding. The touch sensitive surface of the lens can have touch sensors which generate a signal in response to a manually engageable haptic input from a user when the user touches the touch sensitive surface of the lens with a finger. Touch sensors can be located behind the front surface of the lens or behind the back surface of the lens. The user interface and a display module can comprise a light emitting display for emitting light forming an image on the lens in response to the signal. The display module can also have piezoelectric elements that can provide haptics with direct piezoelectric bending action for allowing substantial transfer of mechanical vibration energy.

The modular housing assembly can have a front housing section 110 (FIG. 7), a back housing section 112 (FIG. 1) and rounded corners 113. The back housing can provide a rearward housing with an elongated housing-wall 114 providing a back surface which can comprise the back of the modular housing assembly and electronic communications device. The elongated housing-wall can comprise a back housing-wall or a front housing-wall. The modular impact-resistant curved housing can have transverse walls comprising upright side walls 116 and upright end walls 118 integrally connecting and extending generally perpendicularly from the elongated back housing-wall along an intersection providing the curved corners and curved edges of the periphery of the electronic communications device. The end walls can provide the ends of the electronic communications device with substantially parallel lateral edges. The side walls can provide the sides of the electronic communications device with substantially parallel longitudinal edges.

The mobile electronic communications device can have various control buttons 120 (FIG. 7) including volume control buttons and operating keys 122, such as along one of the sides or ends of the electronic communications device. The control buttons can include an on-off power button, a sleep mode button, an airplane mode button, or combinations thereof. The mobile electronic communications devices can also include various program applications capable of operating at normal or rapid data rate communications. The applications can be represented by different icons. Examples of such applications can include, but are not limited to: a cellular telephone application 124, mobile web browser application 126, e-mail application 128, stock market and/or internet shopping application 130, camera application 132, internet search application 134, and/or social media application 136.

Figure 4:
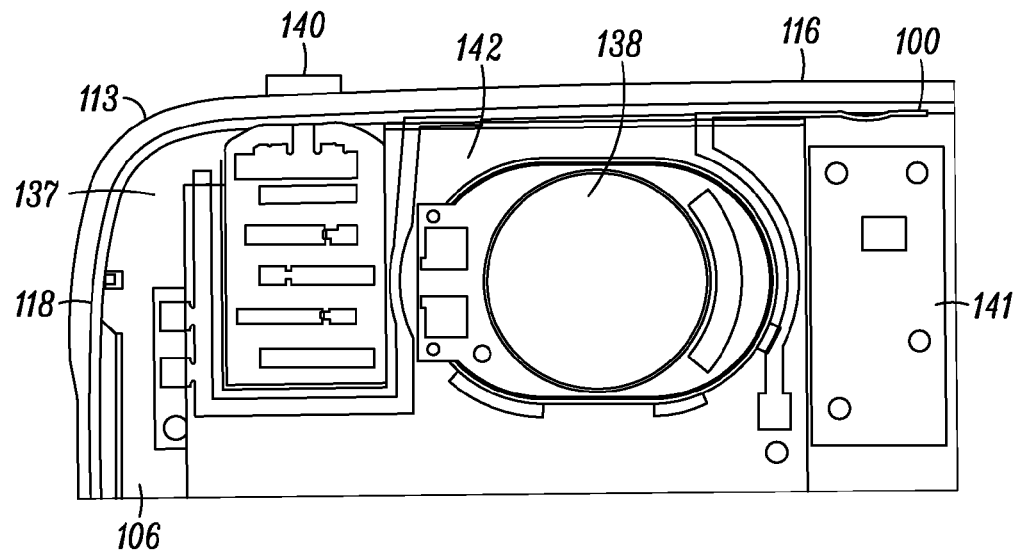
FIG. 4 is an enlarged top view of the multi-functional FPC assembly along with other components of an electronic communications device in accordance with principles of the present invention.
Figure 5:
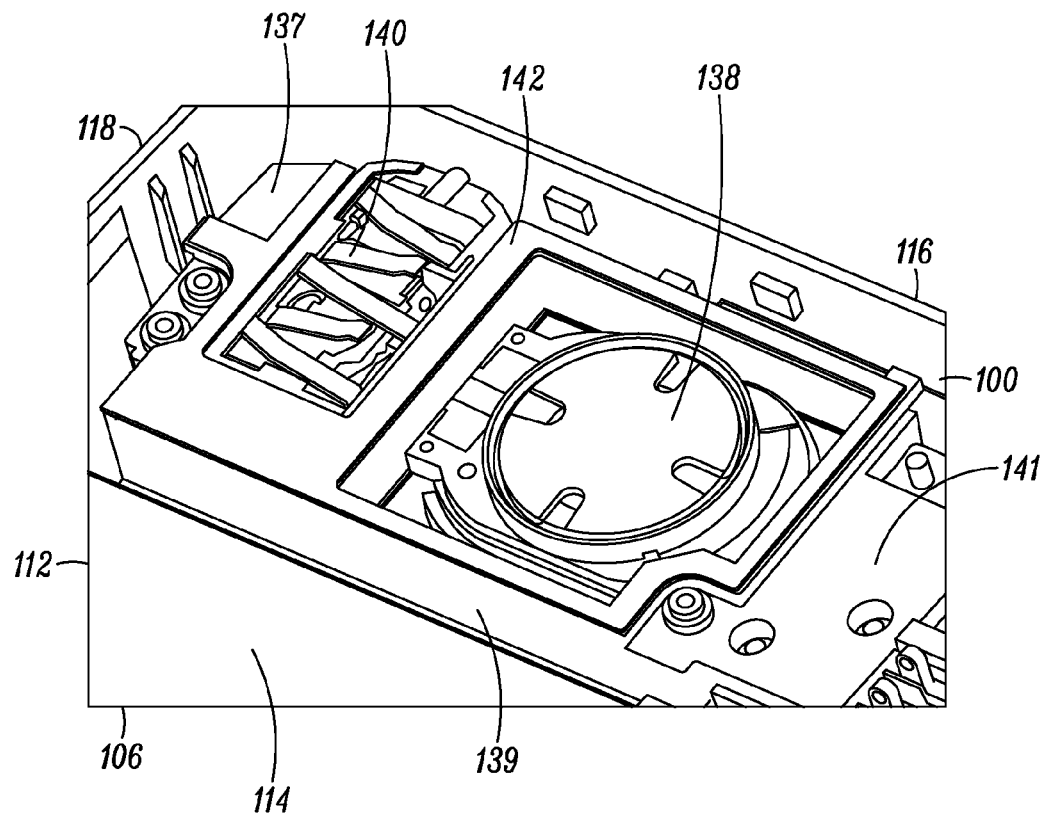
FIG. 5 is a reduced perspective view of the multi-functional FPC assembly along with other components of an electronic communications device in accordance with principles of the present invention.

The modular curved housing can have an inwardly facing interior curved surface 137 (FIGS. 1, 4, 5 and 6) providing a curved concave housing-contour positioned along the elongated housing-wall providing the back surface and transverse upright walls providing the end walls and side walls. The mobile electronic communications device can have a speaker 138 (FIG. 4-6), such as loud speaker comprising an acoustical transducer positioned in proximity to the curved housing and an acoustical chamber 139 (FIGS. 5 and 6) which can also be referred to as an acoustic chamber. The mobile electronic communications device can further have a headset jack 140 (FIGS. 4-6) which in the illustrative embodiment can be positioned opposite a flash printed circuit board (PCB) 141 (FIGS. 4 and 5).

Figure 3:
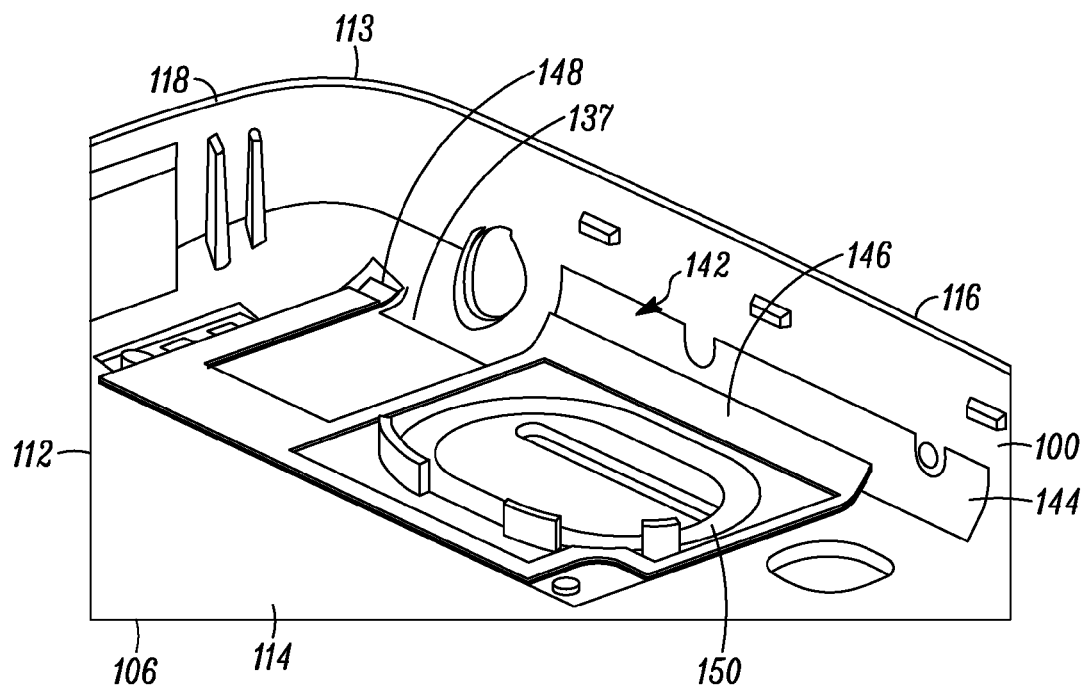
FIG. 3 is a perspective view of part of a multi-functional FPC assembly as shown in FIG. 2 in a inner contoured surface of a housing of an electronic communications device in accordance with principles of the present invention.

Significantly, the mobile electronic communications device can have a compact multi-layered three dimensional (3D) multi-functional (multiple functional) flexible printed circuit (FPC) assembly 142 (FIG. 1) for matingly and securely engaging and abuttingly positioned against the inner back surface and contour of a three dimensional (3D) curved portion of the inwardly facing interior curved surface of the elongated housing-wall and at least one of the transverse upright walls. In particular, when assembled and secured in the housing, the multi-functional FPC assembly can match the 3D contour of the internal surface of part of the housing as shown in FIG. 3.

The FPC assembly can have multiple layers of components including: a curved FPC 144 (FIG. 1) having a FPC-curvature shaped complementary to the housing-contour; a curved acoustic chamber-gasket 146 having a gasket-curvature shaped complementary to portions of the housing-contour and the FPC-curvature and positioned adjacent the acoustical chamber to provide a seal for sealing the acoustical chamber; a gasket-FPC adhesive 148 for bonding and securely coupling the curved gasket to the curved FPC; an elliptical speaker-cover 150 for cushioning and engaging the speaker; FPC-housing adhesive 152 for bonding and securely coupling the curved FPC to the inwardly facing interior curved surface of the curved housing; and speaker-adhesive 154 for bonding and securing the speaker felt to the curved housing. The speaker-cover can comprise: an annular speaker felt, acoustical foam, speaker mesh, or combinations thereof.

The curved FPC can comprise: a flexible curved substrate 156 (FIG. 1); a printed circuit comprising flexible metal conductors 158 secured to the flexible substrate; and at least one and preferable two or more antennas 160 and 162 providing multiple antennas for transmitting and receiving electrical RF signals comprising RF energy. The antennas can be connected and/or grounded to the FPC. The antennas can comprise a first flexible antenna 160 secured to the flexible substrate and a second flexible antenna 162 secured to the flexible substrate. The second flexible antenna is preferably different than the first flexible antenna. Sections of the antennas are spaced from each other. The antennas can comprise three dimensional (3D) shaped antennas arranged in patterns. The antennas can comprise one or more of the following or combinations thereof: RF antenna, wide area network (WAN) antenna, local area network (LAN) antenna, global positioning system (GPS) antenna, WiFi antenna, an antenna compatible with the Bluetooth® communications protocol, multimode antenna, multiple-input/multiple output (MIMO) antenna, multi-band folded inverted conformal antenna, diversity antenna, and/or internal antenna.

Figure 6:
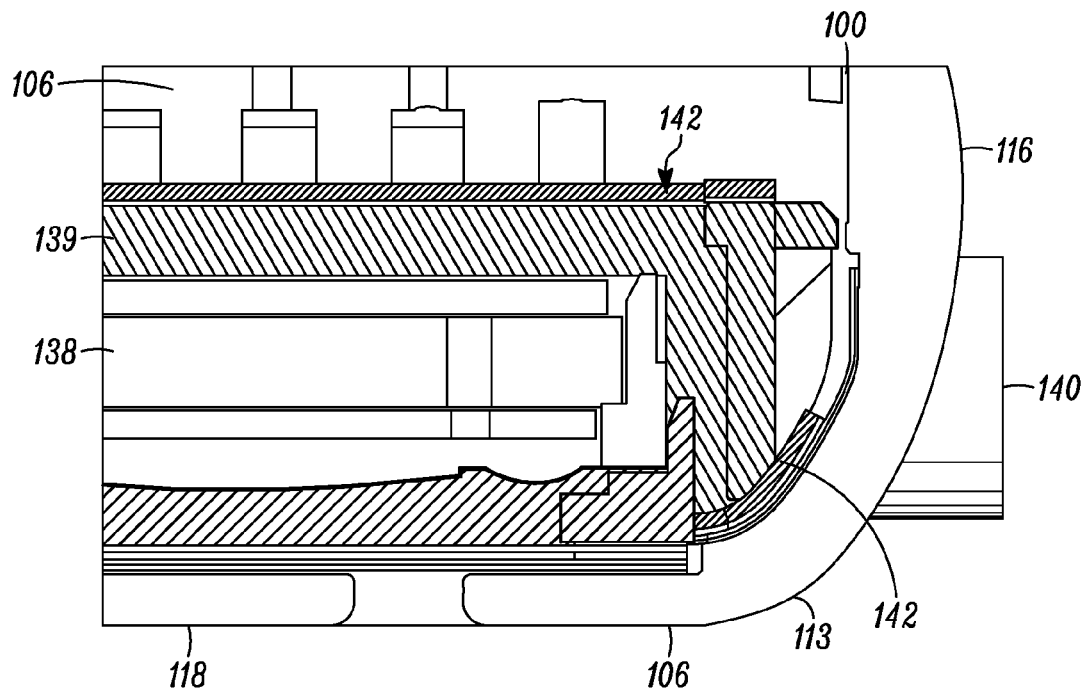
FIG. 6 is an enlarged fragmentary side perspective view of the multi-functional FPC assembly along with other components of an electronic communications device in accordance with principles of the present invention.

The curved acoustic chamber-gasket can comprise one or more of the following: an acoustic seal, a liquid impervious seal, water seal, dust seal, or combinations of any of the preceding seals. The acoustic seal can comprise a loud speaker acoustic seal. The water seal can comprise a headset jack (HSJ) water seal. As shown in FIG. 5, the curved acoustic chamber-gasket can provide a single wall which can extend between and separate the components from the bracket. As shown in FIG. 6, the loud speaker can be positioned closer to the top of the electronic communications device since the acoustic seal can now be positioned on a 3D surface of the housing.

The substrate of the FPC can comprise: a flexible plastic substrate, a flexible substrate film, a flexible laminated board, a flexible board, a flexible circuit board, a single sided substrate, a double sided substrate, or combinations of any of the preceding substrates and/or boards. The flexible metal conductors of the FPC can comprise: metallic foil, copper foil, aluminum foil, or combinations thereof.

In the preferred embodiment, the mobile electronics communications device can comprise: a portable handheld electronic device, such as: a radiotelephone, cellular (cell) phone, mobile phone, smart phone, qwerty phone, flip phone, slider phone, android phone, tablet phone, camera phone, clamshell device, portable networking device, mobile computing device, mobile electronic processor, mobile computer, personal digital assistant (PDA), wireless e-mail device, two way pager, internet communication device, android tablet, ipod, ipad, kindle, electronic reading device, or combinations of any of the preceding.

Among the many advantages of improved mobile electronic communications devices with multi-functional FPC assemblies and the system and method of constructing and using the improved mobile electronic communications devices with multi-functional FPC assemblies are:
1. Superior capability.
2. Superb performance.
3. Better internal volume utilization for commonly grouped set of components.
4. Increased enclosed acoustic back-volume
5. Enhanced manufacturing techniques.
6. Reliable.
7. Compact.
8. Portable.
9. User friendly.
10. Easy to use.
11. Durable.
12. Economical.
13. Attractive.
14. Efficient.
15. Effective.

The mobile electronic device with the multi-functional FPC assembly produced unexpected surprisingly good results.

Although embodiments of the invention have been shown and described, it is to be understood that various modifications, substitutions, and rearrangements of parts, components, and/or process (method) steps, as well as other uses of the improved electronic communications device with the multi-functional FPC assembly can be made by those skilled in the art without departing from the novel spirit and scope of this invention.

What is claimed is:

1. A flexible printed circuit (FPC) assembly for use in an electronic communications device, said electronic communications device having a housing comprising an elongated wall and at least one traverse wall extending from said elongated wall, said housing having an inwardly facing interior surface positioned along said elongated wall and transverse wall, the FPC assembly comprising:
   a flexible curved substrate having a curvature that substantially matches a curvature of said inwardly facing interior surface of said housing, wherein said flexible curved substrate is securely coupled to said inwardly facing interior surface of said housing; and
   a seal between said flexible curved substrate and said housing, said seal having a curvature that substantially matches the curvature of said inwardly facing interior surface of said housing, and said seal being selected from the group consisting of: an acoustic seal, a liquid impervious seal, water seal, duct seal, and combinations thereof.

2. The FPC assembly in accordance with claim 1, wherein said inwardly facing interior surface of said housing comprises a curved surface portion.

3. The FPC assembly in accordance with claim 1, further comprising:
   an adhesive that securely couples said flexible curved substrate to said inwardly facing interior surface of said housing.

4. The FPC assembly in accordance with claim 1, further comprising:
   components coupled to said flexible curved substrate, wherein said components include flexible metal conductors selected from the group consisting of metallic foil, copper foil, aluminum foil, and combinations thereof.

5. The FPC assembly in accordance with claim 1, further comprising multiple antennas coupled to said flexible curved substrate.

6. The FPC assembly in accordance with claim 1, further comprising a speaker felt coupled to said flexible curved substrate.

7. The FPC assembly in accordance with claim 1, wherein said flexible curved substrate is selected from the group consisting of: a flexible plastic substrate, a flexible substrate film, a flexible laminated board, a flexible board, a flexible circuit board, a single sided substrate, a double sided substrate, and combinations thereof.

8. The FPC assembly in accordance with claim 1, further comprising:
   components coupled to said flexible curved substrate, wherein said components are clustered and secured to said flexible curved substrate and said components share common wall surfaces.

9. The FPC assembly in accordance with claim 1, wherein said electronic communications device comprises a portable electronic device selected from the group consisting of:
   a radiotelephone, cellular (cell) phone, mobile phone, smart phone, qwerty phone, flip phone, slider phone, tablet phone, camera phone, clamshell device, portable networking device, portable gaming device, mobile communications device, personal digital assistant (PDA), wireless e-mail device, a two way pager, internet communication device, electronic reading device, electronic photo frame, digital photo frame, digital picture frame, video player, audio player, electronic calculator, electronic monitor, tablet device, video device, computer, netbook, data sharing device, wireless device, handheld electronic communications device, global positioning system (GPS), navigation device, transmitting device, electronic receiving device, electronic planner, workout planner, electronic calendar, scheduling device, music player, MP3 player, performance monitor, golf tracker, incoming call notifier, answering machine, statistical storage device, data storage device, information storage device, cadence sensor, goal setting device, fitness tracker, exercise monitor, sports monitor, workout frequency monitor, data sharing device, hand held electronic device, and combinations thereof.

10. A flexible printed circuit (FPC) assembly for use in an electronic communications device having a curved housing comprising an elongated housing-wall and transverse walls connecting and extending from said elongated housing-wall along an intersection providing rounded corners of a periphery of said electronic communications device, said transverse walls comprising at least one side wall and/or end wall, said housing having an inwardly facing interior curved surface providing a curved housing-contour positioned along said elongated housing-wall and transverse walls, wherein said FPC assembly comprising:
    a curved gasket having a curvature complementary to portions of a curvature of said inwardly facing interior curved surface of said housing;
    an annular speaker-cover comprising speaker felt for cushioning and engaging a speaker;
    a flexible curved substrate having a curvature that substantially matches a curvature of said inwardly facing interior curved surface of said housing, wherein said flexible curved substrate is securely coupled to said inwardly facing interior curved surface of said housing, and wherein said curved gasket between said flexible curved substrate and said housing is secured to said flexible curved substrate, said curved gasket being selected from the group consisting of: an acoustic seal, a liquid impervious seal, a water seal, a dust seal, and combinations thereof;
    a printed circuit comprising flexible metal conductors secured to said flexible curved substrate;
    a first flexible antenna secured to said flexible curved substrate; and
    a second flexible antenna secured to said flexible curved substrate, said second flexible antenna being different than said first flexible antenna, and sections of said second flexible antenna being spaced from said first flexible antenna.

11. The FPC assembly in accordance with claim 10, wherein:
    said flexible curved substrate is selected from the group consisting of: a flexible plastic substrate, a flexible substrate film, a flexible laminated board, a flexible board, a flexible circuit board, a single sided substrate, a double sided substrate, and combinations thereof; and
    said flexible metal conductors are selected from the group consisting of: metallic foil, copper foil, aluminum foil, and combinations thereof.

12. The FPC assembly in accordance with claim 10, wherein at least one of said first and second flexible antennas is selected from the group consisting of: a radio frequency (RF) antenna, wide area network (WAN) antenna, local area network (LAN) antenna, global positioning system (GPS) antenna, multi-mode antenna, multiple-input/multiple output (MIMO) antenna, multi-band folded inverted conformal antenna, diversity antenna, internal antenna, and combinations of any of the preceding antennas, and combinations thereof.

13. The FPC assembly in accordance with claim 10, wherein said electronic communications device comprises a portable electronic device selected from the group consisting of: a radiotelephone, cellular (cell) phone, mobile phone, smart phone, qwerty phone, flip phone, slider phone, android phone, tablet phone, camera phone, clamshell device, portable networking device, mobile communications device, personal digital assistant (PDA), wireless e-mail device, two way pager, internet communication device, electronic reading device, hand held electronic device, and any combination thereof.

14. A flexible printed circuit (FPC) assembly for use in an electronic communications device, said electronic communications device having a housing comprising an elongated wall and at least one traverse wall extending from said elongated wall, said housing having an inwardly facing interior surface positioned along said elongated wall and transverse wall, the FPC assembly comprising:
    a flexible curved substrate having a curvature that substantially matches a curvature of said inwardly facing interior surface of said housing, wherein said flexible curved substrate is securely coupled to said inwardly facing interior surface of said housing; and
    a seal between said flexible curved substrate and said housing, said seal having a curvature that substantially matches the curvature of said inwardly facing interior surface of said housing, and said seal being an acoustic seal.

15. A flexible printed circuit (FPC) assembly for use in an electronic communications device, said electronic communications device having a housing comprising an elongated wall and at least one traverse wall extending from said elongated wall, said housing having an inwardly facing interior surface positioned along said elongated wall and transverse wall, the FPC assembly comprising:

a flexible curved substrate having a curvature that substantially matches a curvature of said inwardly facing interior surface of said housing, wherein said flexible curved substrate is securely coupled to said inwardly facing interior surface of said housing; and a seal between said flexible curved substrate and said housing, said seal having a curvature that substantially matches the curvature of said inwardly facing interior surface of said housing, and said seal being a water seal.

* * * * *